United States Patent
Shin

(10) Patent No.: US 6,339,255 B1
(45) Date of Patent: Jan. 15, 2002

(54) STACKED SEMICONDUCTOR CHIPS IN A SINGLE SEMICONDUCTOR PACKAGE

(75) Inventor: Myoung-Jin Shin, Cheongju (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/422,799

(22) Filed: Oct. 22, 1999

(30) Foreign Application Priority Data

Oct. 24, 1998 (KR) .............................................. 98-44721

(51) Int. Cl.[7] .............................................. H01L 23/02
(52) U.S. Cl. ........................ 257/686; 257/685; 257/690; 257/784; 257/790; 361/730; 361/790
(58) Field of Search ................................. 257/685, 686, 257/777, 678, 684, 687, 688, 690, 784, 790; 361/730, 790

(56) References Cited

U.S. PATENT DOCUMENTS

| | | | | |
|---|---|---|---|---|
| 5,172,303 A | * | 12/1992 | Bernardoni et al. | 361/396 |
| 5,247,423 A | * | 9/1993 | Lin et al. | 361/719 |
| 5,594,275 A | * | 1/1997 | Kwon et al. | 257/686 |
| 5,642,261 A | | 6/1997 | Bond | 361/704 |
| 5,835,988 A | * | 11/1998 | Ishii | 257/684 |
| 5,838,061 A | * | 11/1998 | Kim | 257/686 |
| 5,903,049 A | * | 5/1999 | Mori | 257/686 |
| 5,963,430 A | * | 10/1999 | Londa | 361/790 |
| 6,013,877 A | * | 1/2000 | Degani et al. | 174/264 |
| 6,020,629 A | * | 2/2000 | Farnworth et al. | 257/686 |
| 6,137,163 A | * | 10/2000 | Kim et al. | 257/686 |
| 6,153,928 A | * | 11/2000 | Cho | 257/686 |
| 6,172,423 B1 | * | 1/2001 | Lee | 257/780 |

FOREIGN PATENT DOCUMENTS

JP          4-56262          *  2/1992

* cited by examiner

*Primary Examiner*—Olik Chaudhuri
*Assistant Examiner*—Alonzo Chambliss

(57) ABSTRACT

A stacked semiconductor chip package includes: a substrate including a plurality of conductive pads; a first semiconductor chip mounted on the substrate; and electrically connected to the conductive pads; a plurality of electrical leads provided about the substrate; a first molding part for sealing the substrate and the first semiconductor chip; a second semiconductor chip mounted on an upper surface of the first molding part and electrically connected to the electrical leads; and a second molding part for sealing the second semiconductor chip, the second conductive wires and a portion of the leads.

19 Claims, 5 Drawing Sheets

STACKED SEMICONDUCTOR CHIPS IN A SINGLE SEMICONDUCTOR PACKAGE

BACKGROUND OF THE INVENTION

1. Field of the Invention

The present invention relates to a stacked semiconductor chip package and more particularly to a semiconductor chip package and a fabrication method thereof for packaging a plurality of stackable-type semiconductor chips into a single semiconductor chip package.

2. Description of the Conventional Art

A semiconductor chip package in which a single semiconductor chip is packaged is generally known, and a small outline J-leaded (SOJ) semiconductor chip package is one of several types thereof.

With reference to FIG. 1, a SOJ semiconductor chip package is provided such that a semiconductor chip 1 is fixed to a paddle 3 of a lead frame (not shown) by an insulating adhesive or paste. Pads (not shown) of the semiconductor chip 1 are electrically connected with corresponding internal leads 2 by conductive wires 4. A package body 6 is formed by using material 5 to seal the semiconductor chip 1, the internal leads 2 and the conductive wires 4. Finally, external leads 2 are extended from the internal leads 2 to an exterior of the package body 6, each external lead 2 being formed in a 'J' shape.

However, according to the conventional art, since only a single semiconductor chip is packaged in the semiconductor chip package, when mounting the package on a printed circuit board, an area occupied by the package on the board is always uniform which results in deterioration of the efficiency thereof.

SUMMARY OF THE INVENTION

Accordingly, the present invention is directed to a semiconductor chip package which obviates problems and disadvantages present in the conventional art.

An object of the present invention is to provide a semiconductor chip package in which a plurality of semiconductor chips are packaged to improve integration thereof.

To achieve these and other advantages and in accordance with the purpose of the present invention, as embodied and broadly described, a semiconductor chip package includes: a substrate having first and second conductive pads provided on an upper surface and a lower surface thereof, respectively; a first semiconductor chip attached to the upper surface of the substrate; first conductive wires for electrically connecting the first semiconductor chip to the first conductive pads; a plurality of leads attached to both end portions of the substrate; a first molding part for sealing the substrate, the first semiconductor chip and the first conductive wires; a second semiconductor chip attached on an upper surface of the first molding part; second conductive wires for connecting the second semiconductor chip with the plurality of leads; and a second molding part for sealing the second semiconductor chip, the second conductive wires and a portion of each of the leads.

In addition, to achieve the above object of the present invention, there is provided a method for fabricating a semiconductor chip package which includes: attaching first conductive pads to an upper surface of a substrate in which a circuit is provided; attaching second conductive pads to a lower surface of the substrate; attaching a first semiconductor chip to the upper surface of the substrate; electrically connecting the first semiconductor chip to the first conductive pads; providing a plurality of leads at both end sides of the substrate; forming a first molding part by sealing the first semiconductor chip and the substrate; attaching a second semiconductor chip to an upper surface of the first molding part; electrically connecting the second semiconductor chip to the leads; and forming a second molding part by sealing the second semiconductor chip and a portion of each of the leads.

Here, the substrate may have first conductive pads provided on an upper surface thereof, second conductive pads provided at a lower surface thereof, an opening, and connection means provided at profiles of the opening for electrically connecting the first conductive pads to the corresponding second conductive pads.

It is to be understood that both the foregoing general description and the following detailed description are exemplary and explanatory and are intended to provide and further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1:
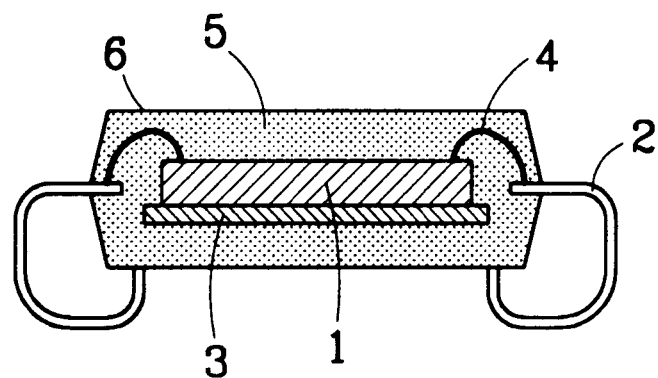
FIG. 1 a vertical cross-sectional diagram of a conventional small outline J-leaded (SOJ) semiconductor chip package.
Figure 2:
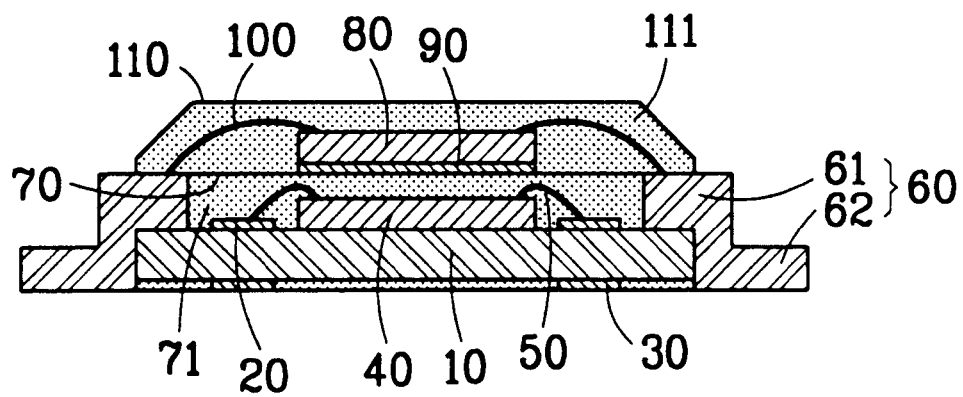
FIG. 2 is a vertical cross-sectional diagram of a semiconductor chip package according to a first embodiment of the present invention.

Reference will now be made in detail to the preferred embodiments of the present invention, examples of which are illustrated in the accompanying drawings. FIG. 2 illustrates a semiconductor chip package according to a first embodiment of the present invention. As shown therein, a substrate 10 is provided having circuit patterns (not shown) laid therein. A plurality of first conductive pads 20 are provided at both end sides on an upper surface of the substrate 10. A plurality of second conductive pads 30 which respectively correspond to the first conductive pads 20 are provided on a lower surface of the substrate 10. The first conductive pads 20 and the corresponding second conductive pads 30 are electrically interconnected to each other via the circuit patterns provided in the substrate 10. Further, a first semiconductor chip 40 which has a plurality of chip pads (not shown) is attached on the substrate 10 between the first conductive pads 20 provided on the both sides of the upper surface of the substrate 10. The chip pads of the first semiconductor chip 40 and the first conductive pads 20 are electrically connected by corresponding first conductive wires 50. In addition, leads 60 are attached at both end portions of the substrate 10. A first molding part 70 is formed in which the substrate 10, the first conductive pad 20, the second conductive pad 30, the first semiconductor chip 40 and the first conductive wires 50—except for the leads 60—are sealed by a molding epoxy resin 71. Here, surfaces of the first molding part 70 and each of the leads 60 have the same upper and lower surface levels.

A second semiconductor chip 80 which has a plurality of chip pads (not shown) and is attached onto a center portion of an upper surface of the first molding part 70 by an adhesive 90. The chip pads of the second semiconductor chip 80 are electrically connected with end portions of corresponding chip connection leads 61 of the leads 60 by second conductive wires 100. Further, there is formed a second molding part 110 in which a predetermined portion of the first molding part 70, including the second semiconductor chip 80 and the second conductive wires 100, is sealed by a molding expoxy resin 111.

In addition, each of the leads 60 includes a substrate connection lead 62 and the chip connection lead 61 which is upwardly bent therefrom, wherein each lead 60 is higher than a height from a bottom surface of the substrate 10 to the first conductive wires 50.

FIGS. 3A–3G sequentially illustrate a method for fabricating the semiconductor chip package according the first embodiment of the present invention.

Figure 3A:
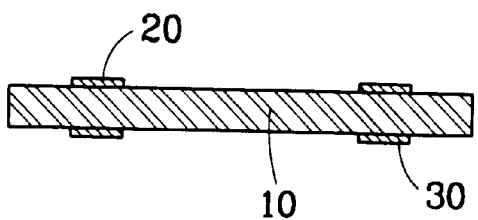
FIGS. 3A–3G are vertical cross-sectional diagrams sequentially illustrating a method for fabricating the semiconductor chip package according the first embodiment of the present invention.

First, as shown in FIG. 3A, the plurality of first conductive pads 20 are provided on the upper surface of the substrate 10. Corresponding to the first conductive pads 20, the plurality of second conductive pads 30 are provided on the bottom of the substrate 10. Conductive circuit patterns (not shown) are laid in the substrate 10. The first conductive pads 20 are connected with the corresponding second conductive pads 30 by the circuit patterns.

Figure 3B:
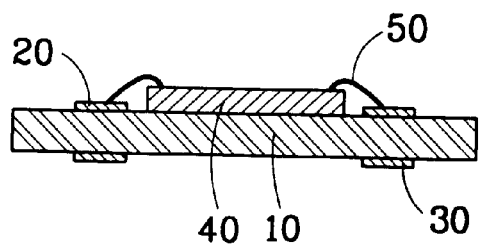

As shown in FIG. 3B, first semiconductor chip 40 having a plurality of chip pads (not shown) is mounted among the first conductive pads 20 onto the substrate 10. The first conductive wires 50 electrically connect the chip pads of the first conductive chip 40 to the corresponding conductive pads 20.

Figure 3C:
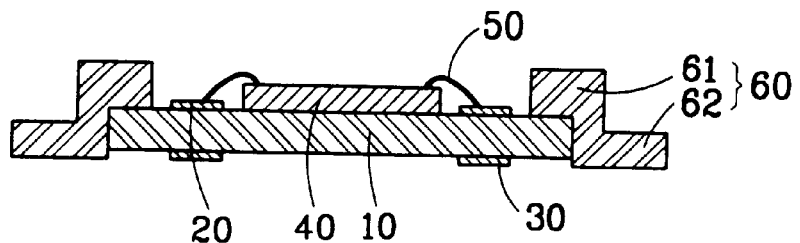

As can be seen in FIG. 3C, the plurality of leads 60 are attached to the both end portions of the semiconductor substrate 10, each lead 60 including substrate connection lead 62 and chip connection lead 61 which is upwardly bent therefrom.

Figure 3D:
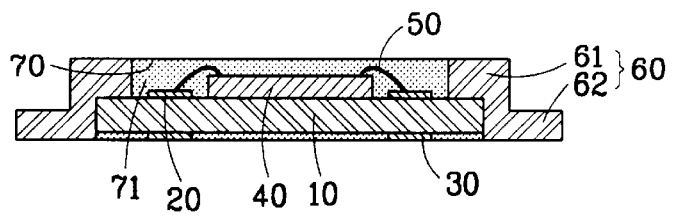

In FIG. 3D, the first molding part 70 is formed, in which predetermined portions, including the substrate 10, the substrate pads 20, 30, the first semiconductor chip 40 and the first conductive wires 50 (except for the leads 60), are sealed by the molding resin 71. Here, it is noted that an epoxy resin is generally used for the molding resin 71. After the molding process, bottoms of second conductive pads 30 are exposed, while upper and lower surfaces of the first molding part 70 and each lead 60 have the same surface level.

Figure 3E:
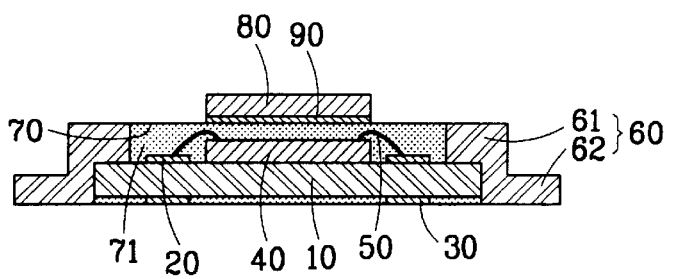

As shown in FIG. 3E, the second semiconductor chip 80 having a plurality of chip pads (not shown) is attached onto the center portion of the upper surface of the first molding part 40 by a adhesive 90.

Figure 3F:
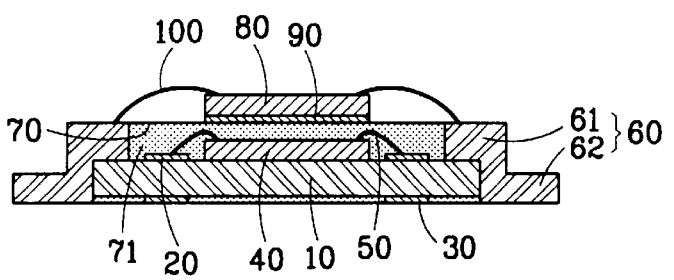

In FIG. 3F, the chip pads of the second semiconductor chip 80 are electrically connected to the corresponding chip connection leads 61 of the leads 60 by corresponding second conductive wires 100.

Figure 3G:
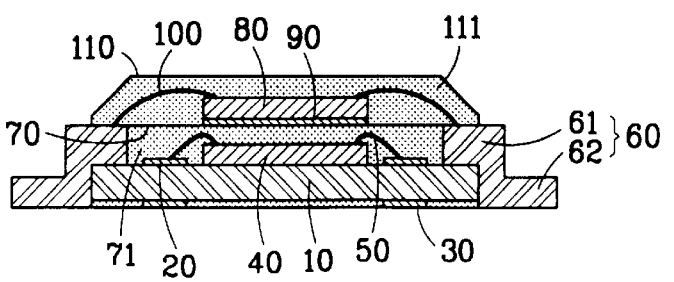

Lastly, as shown in FIG. 3G, second molding part 110 is formed in which the predetermined portions of the first molding part 70, including the second semiconductor chip 80, a portion of the upper surface of each chip connection lead 61 and the second conductive wires 100, are sealed by the molding resin 111. Here, the epoxy resin material is also used for the molding resin 111.

The semiconductor chip package of the present invention may have other structures.

Figure 4:
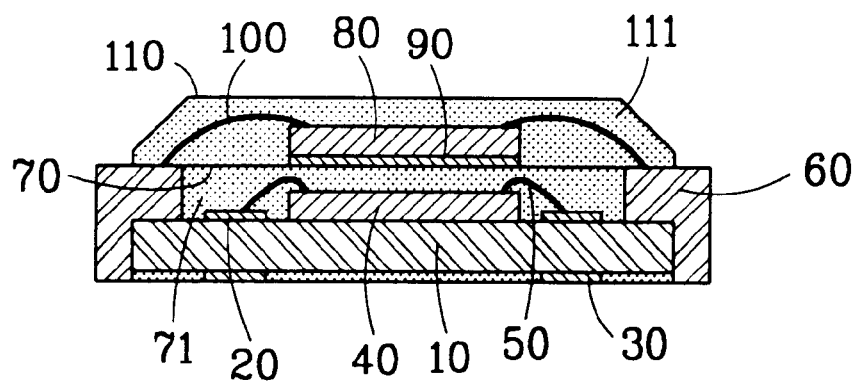
FIG. 4 is a vertical cross-sectional diagram of a semiconductor chip package according to a second embodiment of the present invention.

More specifically, FIG. 4 illustrates a semiconductor chip package according to a second embodiment of the present invention. As shown therein, the only difference with FIG. 2 is the shape of the leads 60, and thus a detailed description of this embodiment will be omitted.

Figure 5:
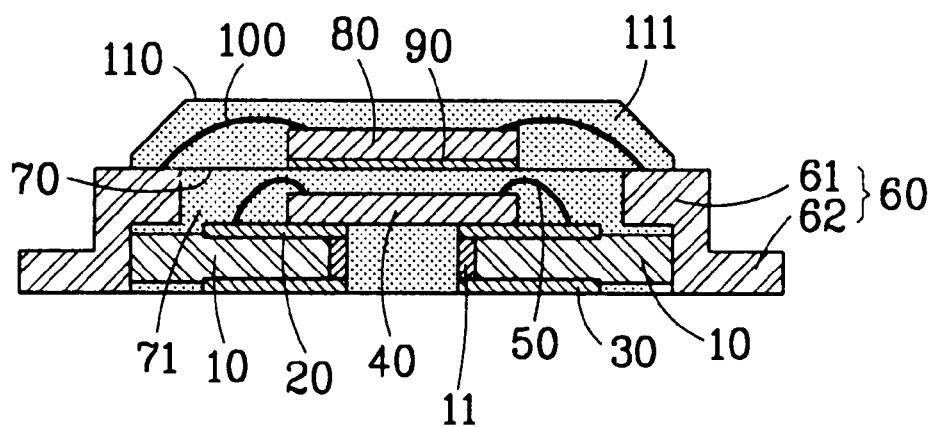
FIG. 5 is a vertical cross-sectional diagram of a semiconductor chip package according to a third embodiment of the present invention.

Meanwhile, FIG. 5 illustrates a semiconductor chip package according to a third embodiment of the present invention. In this embodiment, a substrate 10 has an opening in a center thereof in the vertical direction. Side pads 11 are attached to inner walls of the opening whereby corresponding substrate pads 20, 30 are electrically connected (instead of laying circuit patterns in the substrate 10). Since the other aspects of the structure thereof are identical to that of FIG. 2, a more detailed description of this embodiment will be omitted as well (Refer to FIG. 2).

In general, the semiconductor chip package according to the present invention and discussed hereinabove relates to two (or more) stacked semiconductor chips which are electrically independent from each other. For example, in FIG. 2, semiconductor chip 40 is electrically connected with an exterior of the package through conductive pads 20,30 provided on substrate 10. In contrast, semiconductor chip 80 is electrically connected with an exterior of the package by being electrically connected to leads 60. This arrangement is suitable when each semiconductor chip receives different electrical signals.

Figure 6:
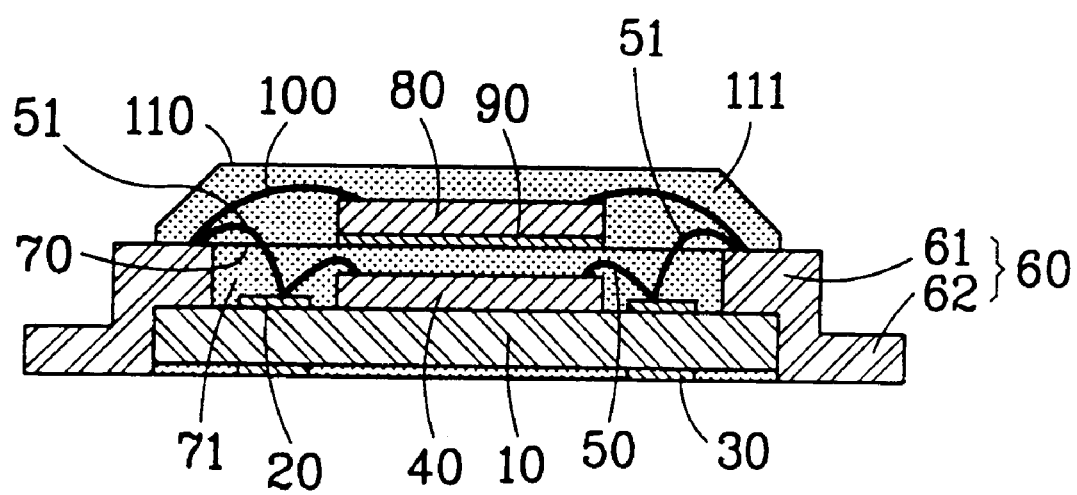
FIG. 6 is a vertical cross-sectional diagram of a semiconductor chip package according to a fourth embodiment of the present invention.

However, it is within the scope of the present invention to provide a stacked semiconductor chip package in which respective semiconductor chips are interconnected, such that each semiconductor chip receives the same electrical signal simultaneously. This may be accomplished in several ways in accordance with the present invention. For example, FIG. 6 is a cross-sectional view of a semiconductor chip package similar to that illustrated in FIG. 2. However, leads 60 are also electrically connected to conductive pads 20 by wires 51, in addition to being electrically connected to semiconductor chip 80. Other arrangements are possible to electrically interconnect semiconductor chips 40 and 80, including without limitation, electrically connecting semiconductor chip 40 to leads 60 directly with wires (i.e., without intervening conductive pads 20).

As described above, the semiconductor chip package according to the present invention has an effect of maximizing memory capacity within a limited area by providing a plurality of semiconductor chips in the single stacked chip package.

It will be apparent to those skilled in the art that various modifications and variations can be made in the semiconductor chip package and the fabrication method thereof of the present invention without departing from the spirit or scope of the invention. Thus, it is intended that the present invention cover the modifications and variations of this invention provided they come within the scope of the appended claims and their equivalents.

What is claimed is:

1. A stacked semiconductor chip package comprising:
  a first molded portion including a first semiconductor chip and a plurality of conductive pads electrically connected to said first semiconductor chip;

a substrate on which said first semiconductor chip is mounted, said substrate including said plurality of conductive pads electrically connected to said first semiconductor chip; and a first molded resin body enclosing said substrate and said first semiconductor chip mounted thereon;

a second molded portion provided on said first molded portion and including a second semiconductor chip mounted therein so as to be electrically active; and a plurality of electrical leads provided about a periphery of said substrate and electrically connected to said second semiconductor chip, said plurality of electrical leads extending from above the first semiconductor chip to below the first semiconductor chip.

2. The semiconductor chip package according to claim 1, wherein said plurality of conductive pads comprises first conductive pads provided on a first surface of said substrate and second conductive pads provided on a second surface of said substrate opposite said first surface, wherein at least some of said first conductive pads are electrically connected to at least some of said second conductive pads.

3. The semiconductor chip package according to claim 2, wherein said second conductive pads are exposed outside of said first molded resin body.

4. The semiconductor chip package according to claim 1, wherein said second molded portion comprises:

said second semiconductor chip mounted on a surface of said first molded portion; and a second molded resin body enclosing said second semiconductor chip and a portion of said plurality of electrical leads.

5. The semiconductor chip package according to claim 4, wherein said second semiconductor chip is adhesively mounted on said surface of said first molded portion.

6. The semiconductor chip package according to claim 4, wherein said second molded resin body is made from an epoxy molding compound.

7. The semiconductor chip package according to claim 1, wherein said plurality of conductive pads comprises first conductive pads provided on a first surface of said substrate and second conductive pads provided on a second surface of said substrate opposite said first surface, wherein said substrate includes a connection hole through which an electrical connector for electrically connecting said first and second conductive pads extends.

8. The semiconductor chip package according to claim 1, wherein said first molded resin body is made from an epoxy molding compound.

9. The semiconductor chip package according to claim 1, wherein said plurality of conductive pads are provided on a side of said substrate on which said first semiconductor chip is mounted.

10. The semiconductor chip package according to claim 1, wherein said first and second semiconductor chips are electrically connected to each other.

11. The semiconductor chip package according to claim 10, wherein said plurality of conductive pads are electrically connected to said plurality of electrical leads.

12. The semiconductor chip package according to claim 1, wherein said first and second semiconductor chips are electrically independent from each other.

13. The semiconductor chip package according to claim 1, wherein said plurality of conductive pads are electrically independent from said plurality of leads.

14. A semiconductor chip package comprising:

a substrate;

a first semiconductor chip mounted on and electrically connected to said substrate;

a plurality of electrical leads provided about a periphery of said substrate and extending from above the first semiconductor chip to below the first semiconductor chip;

a first body portion enclosing said substrate and said first semiconductor chip;

a second semiconductor chip mounted on said first body portion, said second semiconductor chip being electrically connected to said plurality of electrical leads; and a second body portion enclosing said second semiconductor chip and a portion of said plurality of electrical leads.

15. The semiconductor chip package according to claim 14, wherein said plurality of electrical leads are electrically connected to said substrate, such that said first semiconductor chip is electrically connected to said plurality of electrical leads.

16. The semiconductor chip package according to claim 14, wherein said first and second semiconductor chips are electrically independent from each other.

17. A semiconductor chip package, comprising:

a substrate having first and second conductive pads on upper and lower surfaces thereof, respectively;

a first semiconductor chip mounted on said upper surface of said substrate;

first conductive wires for electrically connecting the first semiconductor chip to the first conductive pads;

a plurality of electrical leads provided about a periphery of said substrate and extending from above the first semiconductor chip to below the first semiconductor chip;

a first molded part for sealing said substrate, said first semiconductor chip and said first conductive wires;

a second semiconductor chip mounted on an upper surface of said first molded part;

second conductive wires connecting said second semiconductor chip with said electrical leads; and a second molding part for sealing said second semiconductor chip, said second conductive wires and a portion of said leads.

18. The semiconductor chip package according to claim 17, further comprising third conductive wires connected said first conductive pads and said electrical leads.

19. The semiconductor chip package according to claim 17, wherein said first and second semiconductor chips are electrically independent.

* * * * *